(12) United States Patent
Demiguel et al.

(10) Patent No.: US 7,298,943 B2
(45) Date of Patent: Nov. 20, 2007

(54) MONOLITHIC OPTICAL COMPONENT

(75) Inventors: Stephane Demiguel, Argenteuil Cedex (FR); Louis Giraudet, Reims (FR); Mohand Achouche, Marcoussis (FR)

(73) Assignee: Avanex Corporation, Fremont, CA (US)

( * ) Notice: Subject to any disclaimer, the term of this patent is extended or adjusted under 35 U.S.C. 154(b) by 0 days.

(21) Appl. No.: 10/527,621

(22) PCT Filed: Sep. 10, 2003

(86) PCT No.: PCT/IB03/04425

§ 371 (c)(1),
(2), (4) Date: Feb. 27, 2006

(87) PCT Pub. No.: WO2004/025357

PCT Pub. Date: Mar. 25, 2004

(65) Prior Publication Data

US 2006/0165349 A1    Jul. 27, 2006

(30) Foreign Application Priority Data

Sep. 12, 2002  (FR) .................................. 02 11308

(51) Int. Cl.
G02B 6/32 (2006.01)
(52) U.S. Cl. .......................... 385/35; 385/14; 385/15; 385/27; 385/28; 385/30; 385/31; 385/33; 257/414; 257/428; 257/431; 257/432
(58) Field of Classification Search ............... 257/436, 257/432, 292; 372/22, 18, 19; 359/629, 359/143; 385/15, 30
See application file for complete search history.

(56) References Cited

U.S. PATENT DOCUMENTS

| 4,815,084 A | 3/1989 | Scifres et al. |
| 5,354,709 A | 10/1994 | Lorenzo et al. |
| 5,381,023 A | 1/1995 | Komatsu |
| 5,513,196 A * | 4/1996 | Bischel et al. ................. 372/22 |
| 6,646,317 B2 * | 11/2003 | Takeuchi ..................... 257/436 |

FOREIGN PATENT DOCUMENTS

| EP | 1 233 299 | 8/2002 |
| WO | WO 85/00076 | 1/1985 |

OTHER PUBLICATIONS

Choa et al., "Packaged Relaxed Semiconductor Lasers with Diluted Waveguide Structure", published by IEEE in 1994.*
PCT Search Report, International Application No. PCT/IB03/04425, dated Mar. 16, 2004.

* cited by examiner

Primary Examiner—Brian Healy
Assistant Examiner—Guy G Anderson
(74) Attorney, Agent, or Firm—Patterson & Sheridan, LLP

(57) ABSTRACT

The present invention relates to a monolithic optical component (400) comprising a light-absorbing layer and a waveguide structure (2). The invention is more particularly adapted to a monolithic component (400) comprising an evanescent coupling photodiode (6) integrated with the waveguide (2). The monolithic optical component (400) comprises a light-absorbing layer and a waveguide (2) evanescently coupled with the light-absorbing layer, the waveguide (2) having one end coupled to an input face (12) of the component to receive an input wave, the 10 component (400) being characterized in that the input face is convex.

20 Claims, 5 Drawing Sheets

MONOLITHIC OPTICAL COMPONENT

The present invention relates to a monolithic optical component comprising an active region and a waveguide structure. The invention is more particularly adapted to a monolithic component comprising an evanescent coupling photodiode integrated with the waveguide.

In optical data transmissions, optical fibers are used as light guides and photodiodes as photodetectors, for example. The coupling between the fibers and the photodiodes is of great importance, particularly to obtain a good response coefficient ("responsivity") of the photodiode. The responsivity of a photodiode denotes the electrical current at the output of the photodiode per unit of incident optical power and is expressed in amperes/watt (A/W).

Figure 1:
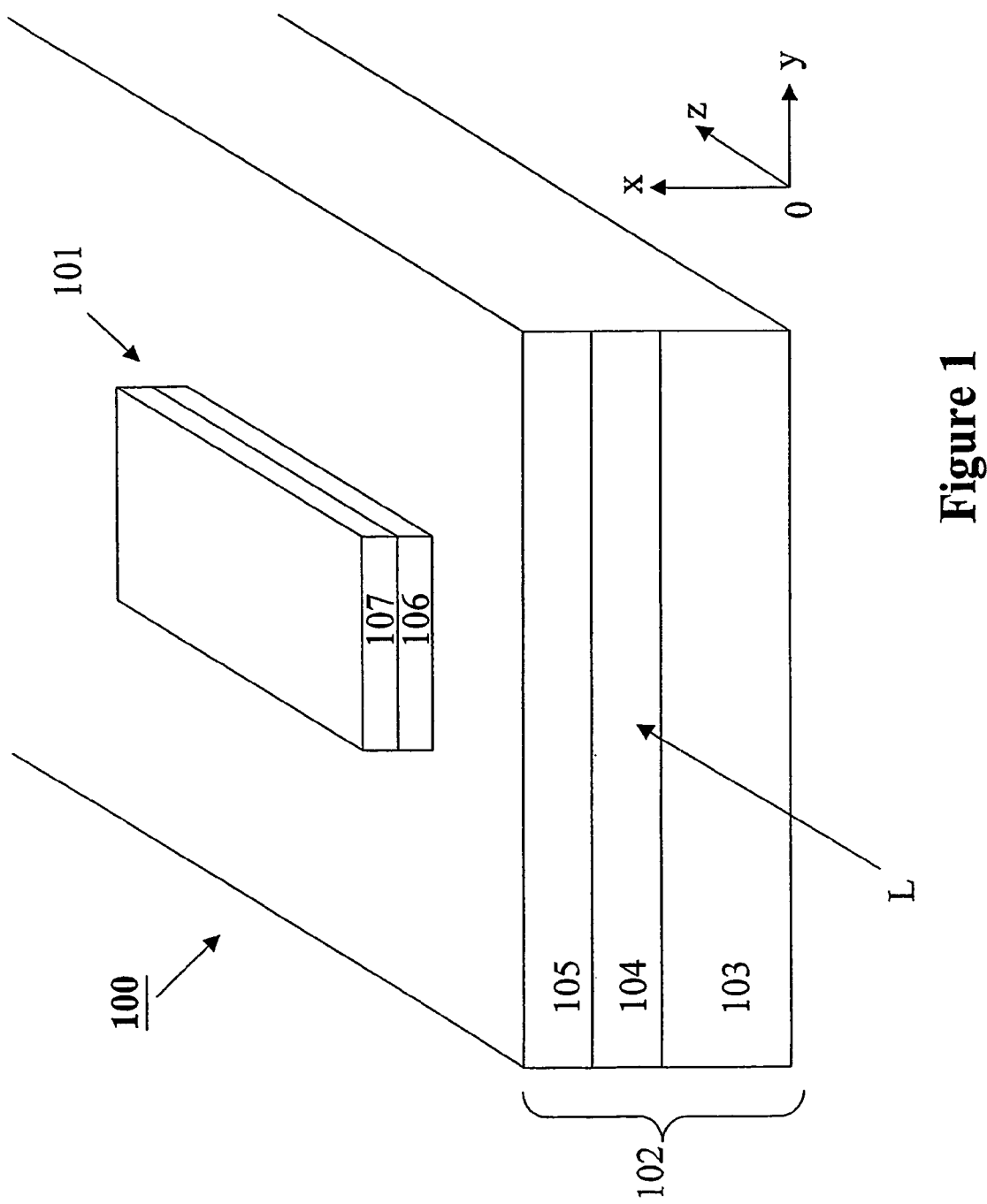

In order to increase the responsivity of the photodiodes and improve the coupling between the optical fiber and the photodiode, WGPD type (Waveguide Photodiode) components have been developed. These are monolithic components incorporating a lateral illumination photodiode and a waveguide coupled to the photodiode using coupling by evanescent wave, known as evanescent coupling. FIG. 1 is a very schematic representation of such a known component 100. The component 100 comprises:
a flat waveguide structure 102 comprising a substrate 103 on which two semiconductor layers 104 and 105 are deposited, located in the plane yOz,
a photodiode 101.

The layer 105 has a higher optical index than the layer 104, which itself has a higher optical index than that of the substrate 103.

The photodiode 101 has a light-absorbing layer 106 with a higher refractive index than that of the layer 105 on which it is deposited, and a semiconductor layer 107 deposited on the layer 106.

In the case of a PIN type photodiode 101, the layer 106 is an intrinsic layer, i.e. not intentionally doped; the layer 107 is P-doped and layer 105, for example, is used to obtain N-type doping.

The optical mode L from a fiber is injected for example at the level of the layer 104 in the direction Oz.

The mode is confined in the direction Ox because the refractive index of the layer 105 is higher than the refractive indices of the substrate 103 and the layer 104, and disperses in the plane yOz because it is not confined as there is no difference in refractive indices in this plane.

The photodiode 101 is said to be evanescently coupled to the flat waveguide 102 via its light-absorbing layer 106: the mode thus rises and is absorbed in the photodiode 101 because the refractive index of the light-absorbing layer 106 is higher than that of the layer 104. The optical mode will rise more or less quickly depending on the refractive indices of the layers used. Thus, the layer 105 is used to raise the optical mode more quickly; it can however either be omitted or have a lower refractive index than that of the layer 104, and the optical mode will then rise more slowly towards the light-absorbing layer 106.

The photodiode 101 is said to be a lateral illumination photodiode because the optical mode propagates in the direction Oz.

Such a representation is schematic and the structure of the waveguide coupled evanescently to a photodiode is generally more complex with, in particular, a plurality of layers with different refractive indices and/or graded index layers.

High-speed optical communications, particularly of the order of 40 Gbit/s, require that the size of the components such as the photodiodes be reduced in order to decrease the equivalent capacity of the component. The reduction of this capacity leads to an increase in the operating frequency of the component.

However, such a reduction in size poses certain difficulties if a planar waveguide and a photodiode are coupled to each other.

The lateral dispersion of the optical mode, which is confined only in the vertical direction, implies significant losses at the reduced absorbing area of the photodiode.

A first solution to this problem consists of increasing the area of the absorbing layer of the photodiode in accordance with the size of the divergent beam, so that the absorbing layer expands like the beam. Such a structure 200 is shown in a top view in FIG. 2, which represents an optical fiber 10 emitting a beam 11 entering a planar waveguide 201 and coupled evanescently to a photodiode with a light-absorbing layer 202. The area of the layer 202 in the plane of the figure has been increased and has a trapezoid shape to take into account the divergence of the beam.

However, such an increase in the size of the photodiode limits the operating frequency. The size of the photodiode remains large and the equivalent capacity of the photodiode is therefore sufficiently high to limit the operating frequency to approximately 10 GHz, whilst maintaining high sensitivity.

Figure 3:
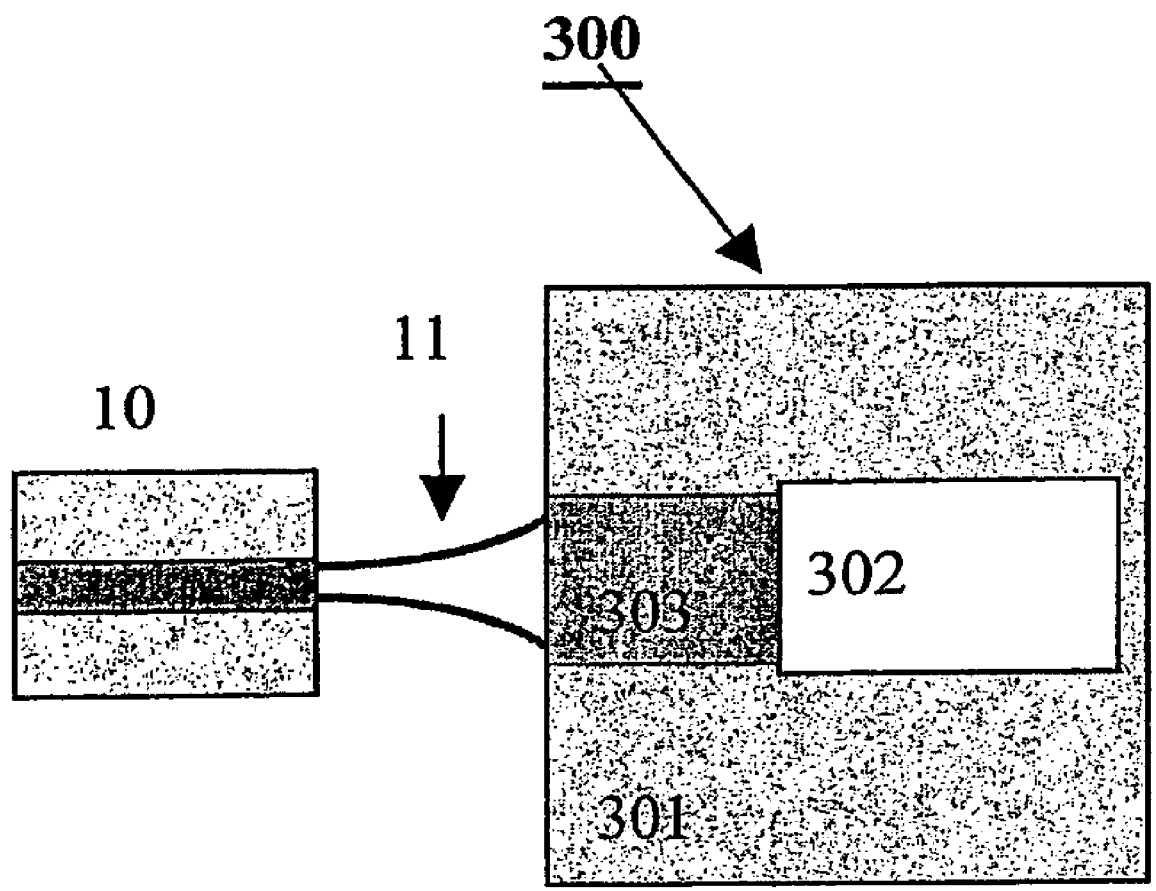

A second solution consists of producing an etched waveguide structure 300 as shown in a top view in FIG. 3. FIG. 3 represents an optical fiber 10 emitting a beam 11 entering a waveguide 301 and coupled evanescently to a photodiode with a light-absorbing layer 302. The waveguide 301 has a ribbon or "ridge" 303 obtained by a dry etching process and allowing lateral confinement of the light in the plane of the ridge. As the ridge 303 ends under the light-absorbing face 302 of the photodiode and is narrower than the layer 302, the light is guided to the photodiode, preventing losses due to the divergence of the beam 11.

However, such a solution poses certain problems.

The extreme narrowness of the ridge requires submicron alignment of the ridge, the alignment being very complex and costly to achieve. Moreover, the production of such a structure requires a large number of masking levels, of the order of approximately fifteen, increasing the cost of the component. Finally, the dry etching process used causes roughness on the walls and edges of the waveguide, leading to a loss of propagation and low responsivity of the photodiode, limited to approximately 0.5 A/W at 40 Gbit/s.

The present invention aims to provide a simple and economical monolithic optical component providing good responsivity for use at high data speeds such as 40 Gbit/s or more, without the problems of roughness of the walls and edges of the waveguide.

To this end, the present invention proposes a monolithic optical component comprising:
a light-absorbing layer,
a waveguide coupled evanescently with the light-absorbing layer, the waveguide having one end coupled to an input face of the component to receive an input wave, the component being characterized in that the input face is convex.

Due to the convex shape of the input face, the waveguide will focus the optical mode from an optical fiber. The lateral dispersion of the mode on either side of the light-absorbing layer is thus considerably reduced. This type of structure allows the area of the absorbing layer of the photodiode to be limited and the responsivity of the photodiode to be greater than 0.5 A/W at 40 Gbit/s, for example approximately 0.8 A/W.

The input face is advantageously a cylindrical diopter with generators perpendicular to the plane of the said light-absorbing layer.

As the light is confined along the perpendicular to the plane of the said light-absorbing layer, it is unnecessary to use a spherical diopter. Moreover, due to etching technology, it is much simpler to obtain a cylindrical diopter.

The radius of curvature of the cylindrical diopter is advantageously of the order of 20 µm.

The optical component advantageously comprises a photodiode incorporating the said light-absorbing layer. The light-absorbing layer is for example an intrinsic semiconductor layer in a PIN diode.

According to an embodiment, the waveguide is a diluted waveguide.

A diluted waveguide contains a plurality of layers of a material with a high refractive index such as a 1.25 µm InGaAsP quaternary, i.e. with a photoluminescence peak at 1.25 µm. The thicknesses of these layers vary and each of the layers is surrounded by two layers of a material with a lower index such as an InP binary. Such a configuration allows a pre-determined index profile to be obtained by adjusting the thicknesses of the InP layers, and allows in particular an index profile to be obtained that increases when approaching the light-absorbing layer, in order to raise the light quickly towards the light-absorbing layer. The use of a single quaternary material also imposes few manufacturing constraints to vary the indices, unlike waveguides using materials with different compositions.

The said waveguide advantageously comprises at least:
a first InP layer,
an InGaAsP layer deposited on the said first InP layer,
a second InP layer deposited on the said InGaAsP layer, Other characteristics and advantages of the present invention will appear in the following description of an embodiment of the invention, given by way of illustration and in no way limiting.

Figure 2:
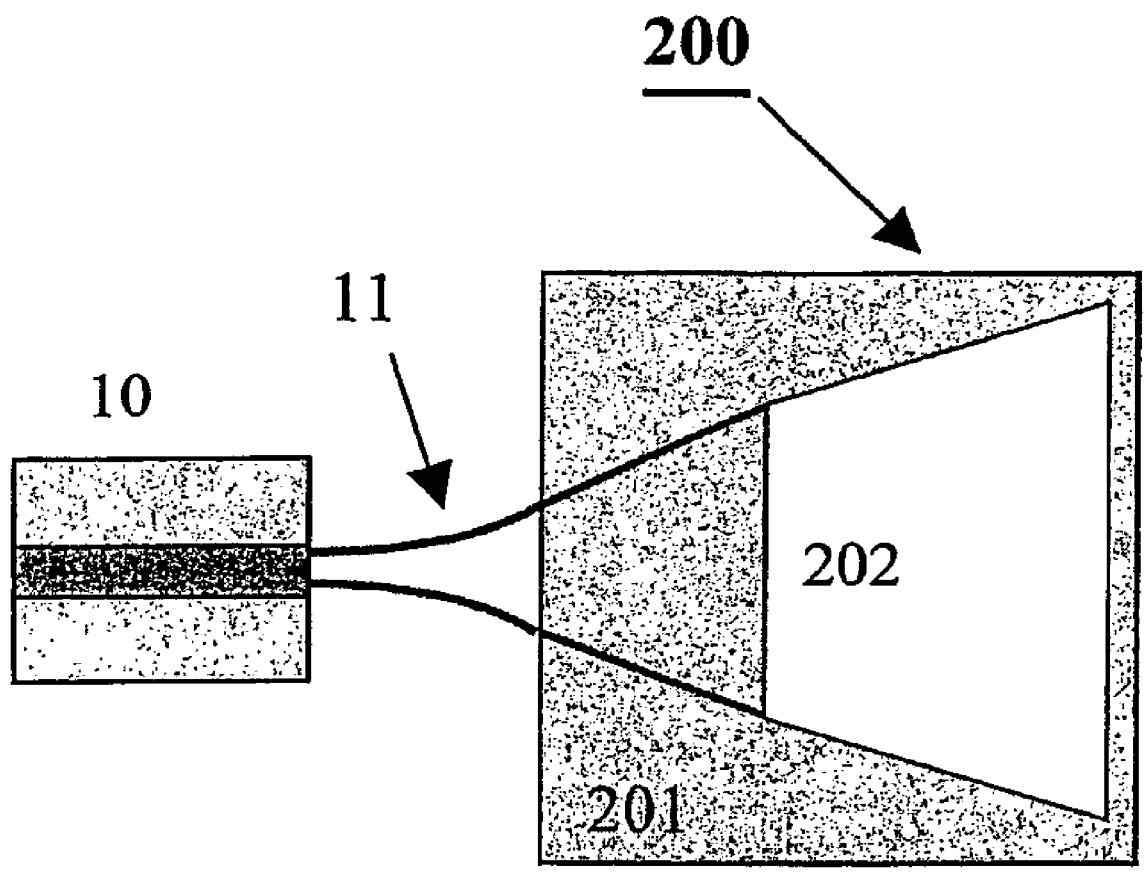
Figure 4:
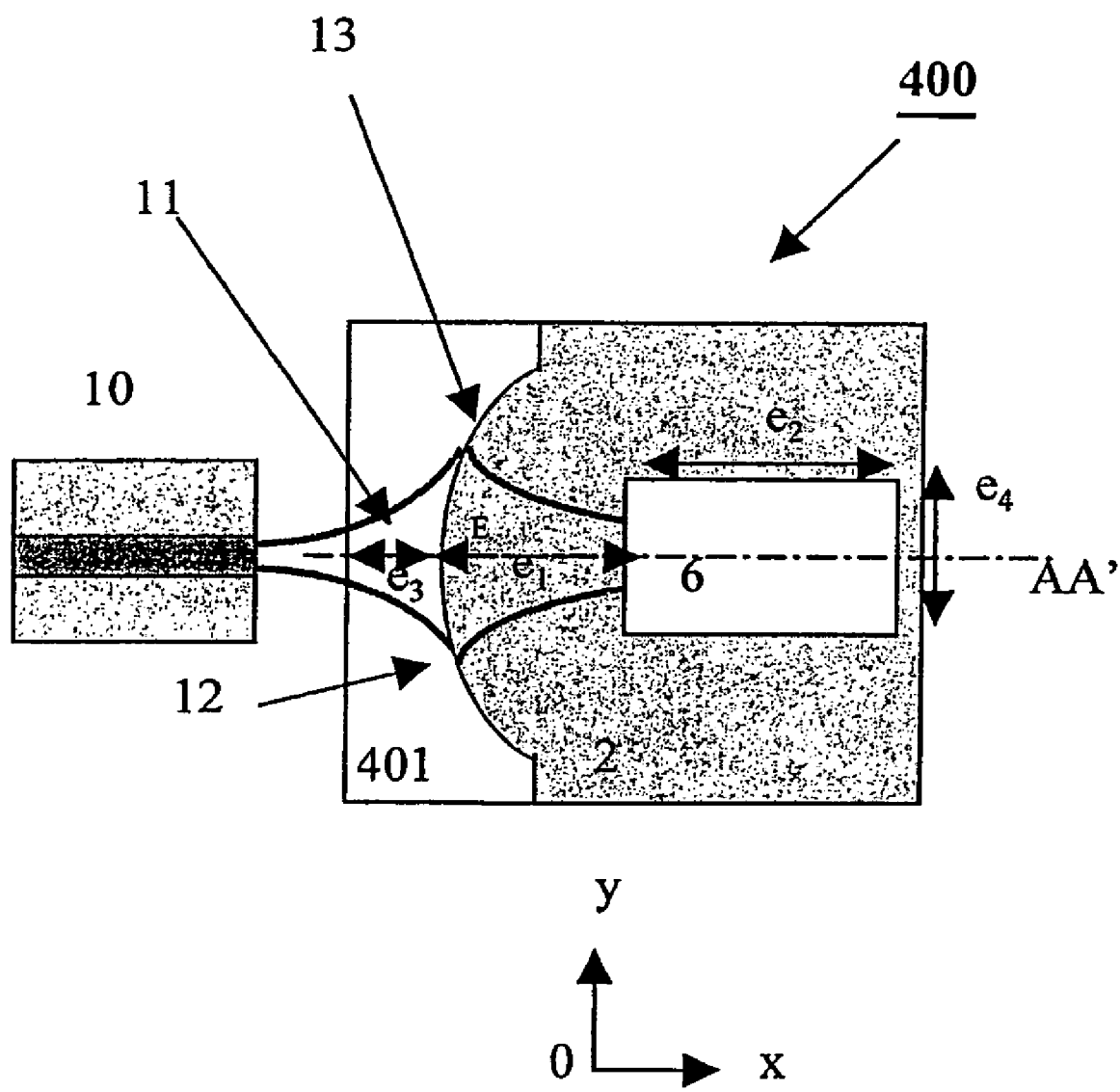
Figure 5:
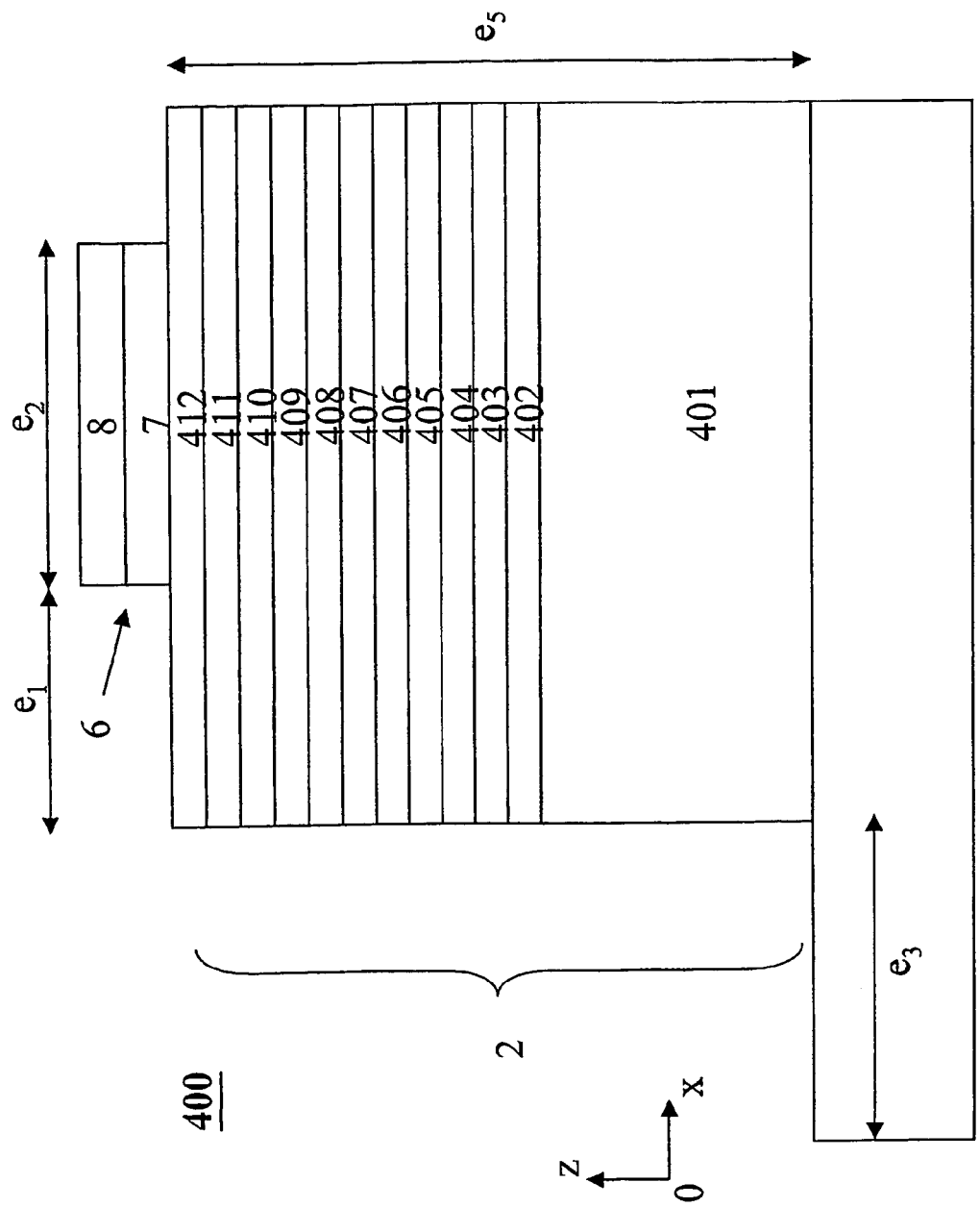

In the following figures:

FIG. 1 schematically shows a first embodiment of a monolithic optical component according to the prior art, incorporating a lateral illumination photodiode and a planar waveguide evanescently coupled to the photodiode, FIG. 2 schematically shows a top view of a second embodiment of a monolithic optical component according to the prior art, incorporating a lateral illumination photodiode and a planar waveguide evanescently coupled to the photodiode, FIG. 3 schematically shows a third embodiment of a monolithic optical component according to the prior art, incorporating a lateral illumination photodiode and an etched waveguide evanescently coupled to the photodiode, FIG. 4 schematically shows a top view of a monolithic optical component according to an embodiment of the invention, incorporating a lateral illumination photodiode and a planar waveguide evanescently coupled to the photodiode, FIG. 5 schematically shows a cross-section of the component as shown in FIG. 4 along the plane AA'.

In all the figures, the common elements have the same reference numbers.

FIGS. 1 to 3 have already been described in relation to the state of the art.

FIG. 4 schematically shows a top view of a monolithic component 400 incorporating a lateral illumination photodiode 6 and a planar waveguide 2 coupled evanescently to the photodiode 6 and deposited on a substrate 401. The planar guide 2 is coupled to an input facet 12 of the component receiving a Gaussian optical mode 11, for example 3.5 µm in diameter at a wavelength of 1.55 µm, coming from a lensed optical fiber 10. The optical mode is confined along the perpendicular to the plane of the waveguide and the light-absorbing layer of the photodiode 6, i.e. in the perpendicular direction to the plane of FIG. 4.

The input facet 12 is a convex convergent cylindrical diopter 13, the generators of the cylinder of the diopter being perpendicular to the plane xOy. The radius of curvature of the diopter is approximately 15 µm.

The photodiode 6 has a width $e_4$ in the direction Oy that is 5 µm and a length $e_2$ in the direction Ox that is approximately 25 µm. In the direction Ox, it is located at a distance $e_1$ from point E of the input facet 12. Distance $e_1$ is approximately 20 µm.

The photodiode 6 and the waveguide 2 are obtained by etching after epitaxy on the substrate 401. This can be any type of epitaxy, such as an MBE (Molecular Beam Epitaxy) or MOCVD (Molecular Organometallic Chemical Vapor Deposition). Similarly, the etching can be a chemical etching or dry etching using a reactive plasma. The input facet 12 in the form of a cylindrical diopter can be obtained by using double masking obtained using a deposition of materials such as silicon nitride $Si_3N_4$ or silicon dioxide $SiO_2$ and then a photosensitive resist.

FIG. 5 schematically shows a cross-section of the component 400 as shown in FIG. 4 along the plane AA', and shows the different semiconductor layers of the component.

The waveguide 2 has layers 402 to 412 and a part of the substrate 401, etched over a height $e_5$, in the direction Oz, of approximately 7 µm, and corresponding to the height of the diopter cylinder. The etching extends over a depth e3 of between 5 and 10 µm in the direction Ox.

The photodiode 6 is a PIN diode with a P-doped layer 8 and an intrinsic light-absorbing, i.e. undoped, layer 7. The N-doping of the photodiode 6 is obtained due to the layers 412 to 402 of the waveguide 2.

The materials, dopings and thickness of the layers are given in table 1 below as an example.

TABLE 1

| Layers | Materials | Doping | Thickness |
| --- | --- | --- | --- |
| 8 | InP | P | 0.5 µm |
| 7 | InGaAs | I | 0.4 µm |
| 412 | 1.42 µm InGaAsP | N | 0.34 µm |
| 411 | InP | N | 0.36 µm |
| 410 | 1.25 µm InGaAsP | N | 0.16 µm |
| 409 | InP | N | 0.06 µm |
| 408 | 1.25 µm InGaAsP | N | 0.16 µm |
| 407 | InP | N | 0.44 µm |
| 406 | 1.25 µm InGaAsP | N | 0.16 µm |
| 405 | InP | N | 0.26 µm |
| 404 | 1.25 µm InGaAsP | N | 0.16 µm |
| 403 | InP | N | 0.66 µm |
| 402 | 1.25 µm InGaAsP | N | 0.16 µm |
| 401 | InP | SI | Substrate |

The real parts of the refractive indices of InGaAs, 1.42 µm InGaAsP, 1.25 µm InGaAsP and InP are 3.59, 3.4, 3.35 and 3.17 respectively at a wavelength of 1.55 µm.

Each layer of 1.25 µm InGaAsP is surrounded by two layers of InP with a lower index than the 1.25 µm InGaAsP. The fact that the thickness of the layers of InP is varied allows an index profile to be obtained in the waveguide 2, the waveguide being known as diluted as opposed to a waveguide obtained from solid materials with different refractive indices, such as different compositions of the InGaAsP quaternary.

The use of the layer 412 of 1.42 µm InGaAsP allows the optical mode to be raised even more quickly towards the light-absorbing layer 7.

Such a structure allows for example responsivity of approximately 0.8 A/W.

Of course, the invention is not limited to the embodiment which has just been described.

In particular, the invention has been described with a diluted waveguide, which can be replaced by a graded index waveguide obtained by the superposing of several layers of different materials.

Finally, any of the means can be replaced by an equivalent means without departing from the scope of the invention.

The invention claimed is:

1. A monolithic optical component comprising:
   a light-absorbing layer,
   a waveguide coupled evanescently with the said light-absorbing layer, such waveguide having one end coupled with an input face of the component to receive an input wave, and
   the component being characterized in that the input face is convex.

2. The optical component according to claim 1, wherein the input face has the shape of a convex diopter with generators perpendicular to the plane of the light-absorbing layer.

3. The optical component according to claim 2, wherein the radius of curvature of the convex diopter is of the order of 20 µm.

4. The optical component according to claim 1, further comprising a photodiode incorporating the light-absorbing layer.

5. The optical component according to claim 1, wherein the waveguide is a diluted waveguide.

6. The optical component according to claim 1, wherein the waveguide comprises at least:
   a first InP layer,
   an InGaAsP layer deposited on the first InP layer, and
   a second InP layer deposited on the InGaAsP layer.

7. The optical component according to claim 1, wherein the shape of the input face is formed by an etching process.

8. The optical component according to claim 2, wherein the convex diopter shape of the input face is formed by utilizing a deposition of materials and a photosensitive resist.

9. The optical component according to claim 7, wherein the deposition of materials comprises a layer of silicon nitride.

10. The optical component according to claim 7, wherein the deposition of materials comprises a layer of silicon dioxide.

11. A monolithic optical component comprising:
    a photodiode; and
    a waveguide coupled evanescently to the photodiode via a light-absorbing layer, the waveguide having one end coupled with an input face that is configured to receive an input wave, wherein the input face is convex.

12. The optical component according to claim 11, wherein the shape of the input face is formed by an etching process.

13. The optical component according to claim 11, wherein the input face has the shape of a convex diopter.

14. The optical component according to claim 11, wherein the convex diopter shape of the input face is formed by utilizing a deposition of materials and a photosensitive resist.

15. The optical component according to claim 11, wherein the waveguide is a diluted waveguide.

16. A monolithic optical component comprising:
    a photodiode; and
    a waveguide coupled to the photodiode via a light-absorbing layer, the waveguide having one end coupled with an input face that is configured to receive an input wave, wherein the input face is formed by utilizing a deposition of materials and a photosensitive resist such that the input face has a shape of a convex diopter.

17. The optical component according to claim 16, wherein the waveguide comprises an InP layer and an InGaAsP layer.

18. The optical component according to claim 17, wherein the InGaAsP layer has a thickness of 0.16 µm.

19. The optical component according to claim 16, wherein the convex diopter is a convex convergent diopter.

20. The optical component according to claim 16, wherein the waveguide is a diluted waveguide.

* * * * *